United States Patent [19]

Kaede

[11] Patent Number: 5,202,791
[45] Date of Patent: Apr. 13, 1993

[54] OPTICAL AMPLIFYING APPARATUS

[75] Inventor: Kazuhisa Kaede, Tokyo, Japan
[73] Assignee: NEC Corporation, Tokyo, Japan
[21] Appl. No.: 821,064
[22] Filed: Jan. 16, 1992

[30] Foreign Application Priority Data

Jan. 16, 1991 [JP] Japan ................................. 3-002931

[51] Int. Cl.$^5$ .......................... H01L 31/12; H01S 2/20
[52] U.S. Cl. ................................... 359/345; 359/187; 359/194; 359/239
[58] Field of Search ................ 359/187, 188, 194, 195, 359/239, 337, 345; 385/2; 369/106; 606/11, 12

[56] References Cited

U.S. PATENT DOCUMENTS

| | | | |
|---|---|---|---|
| 4,554,510 | 11/1985 | Shaw et al. | 359/194 |
| 4,839,614 | 6/1989 | Hill et al. | 372/32 |
| 4,856,899 | 8/1989 | Iwaoka et al. | 359/194 |
| 4,947,134 | 8/1990 | Olsson | 359/187 |
| 5,040,033 | 8/1991 | Dutta et al. | 372/50 |

FOREIGN PATENT DOCUMENTS 2230912 10/1990 United Kingdom ................ 359/345

Primary Examiner—Nelson Moskowitz
Attorney, Agent, or Firm—Sughrue, Mion, Zinn, Macpeak & Seas

[57] ABSTRACT

An optical amplifying apparatus is disclosed which includes an optical amplifier for amplifying a signal light, a narrow-band optical filter for removing a spontaneous light emitted from the signal light, two photodetectors for detecting, transmitting and reflecting lights of the narrow-band optical filter, and a controller for controlling a gain of the optical amplifier by comparing intensities of the transmitting and reflecting lights in accordance with the detected signals supplied from the photodetectors.

8 Claims, 10 Drawing Sheets

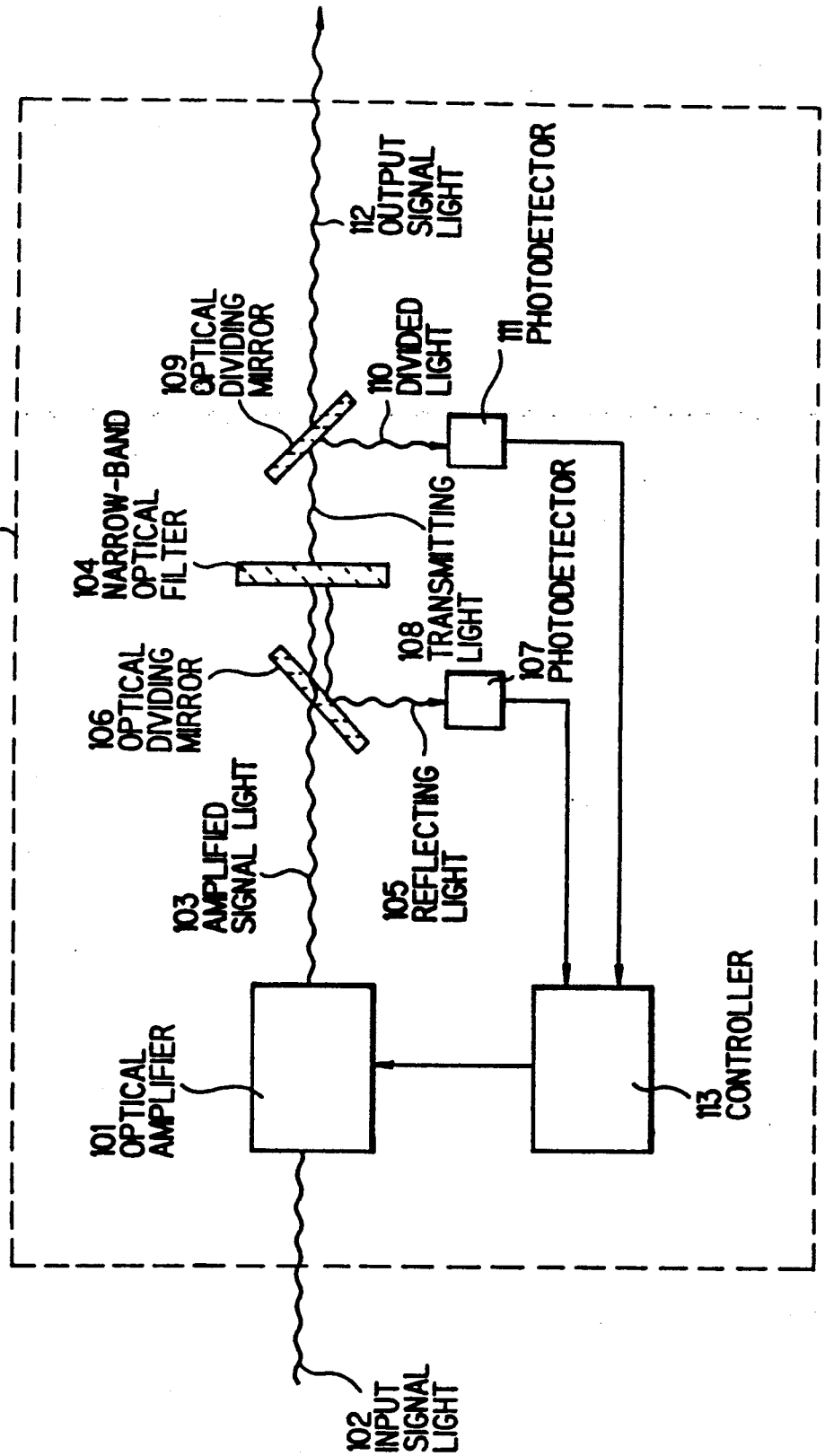

OPTICAL AMPLIFYING APPARATUS

FIELD OF THE INVENTION

This invention relates to an optical amplifying apparatus, and more particularly to, an optical amplifying apparatus used in optical communication systems, etc.

BACKGROUND OF THE INVENTION

In an optical communication system, an optical amplifying apparatus is used as an optical repeater in which a signal light is amplified directly by an optical amplifier. An output of the optical amplifying apparatus is required to be maintained at a constant level so that the output level thereof is monitored continuously by monitoring a power level of a light which is obtained directly by dividing the output of the optical amplifying apparatus. However, the output light includes a spontaneous light emitted from the optical amplifier as well as the optical signal so that the monitoring is affected by the spontaneous light. In order to remove the influence of the spontaneous light, a low frequency signal which is monitored is added to a signal light. Then, some part of the amplified light is divided to be converted to an electric signal for the monitoring purpose. This system has been described on pages 4 to 38 of the proceeding paper of the Autumn National Assembly of Electronic Information Communication Society, vol. 4, 1989, entitled, "Examination of a semiconductor laser optical amplifying repeater."

The conventional amplifying apparatus, however, has a disadvantage in that the wavelength dispersion becomes large in an optical fiber, because there occurs a so called "wavelength chirping" in which the frequency of the signal light is modulated by adding the low frequency signal to the signal light. Such a wavelength dispersion causes a transmission length to be shortened in the optical communication.

SUMMARY OF THE INVENTION

Accordingly, it is an object of the invention to provide an optical amplifying apparatus in which the influence of the spontaneous light from the optical amplifier is released or removed in controlling a gain thereof.

It is another object of the invention to provide an optical amplifying apparatus in which a gain thereof is controlled without adding the low frequency signal to the signal light.

According to a feature of the invention, an optical amplifying apparatus comprises:

means for amplifying a signal light;

means for removing spontaneous light emitted as contained in the amplifying means from the signal light;

first means for detecting a first light which is transmitted through the removing means to provide a first electric signal;

second means for detecting a second light which reflects at the removing means to provide a second electric signal; and means for controlling a gain of the amplifying means by comparing intensities of the first and second lights in accordance with the first and second electric signals.

BRIEF DESCRIPTION OF THE DRAWINGS

The invention will be explained in more detail in conjunction with appended drawings wherein:

FIG. 1 is a block diagram of an optical amplifying apparatus in a first preferred embodiment according to the invention;

DESCRIPTION OF THE PREFERRED EMBODIMENTS

Figure 2A:
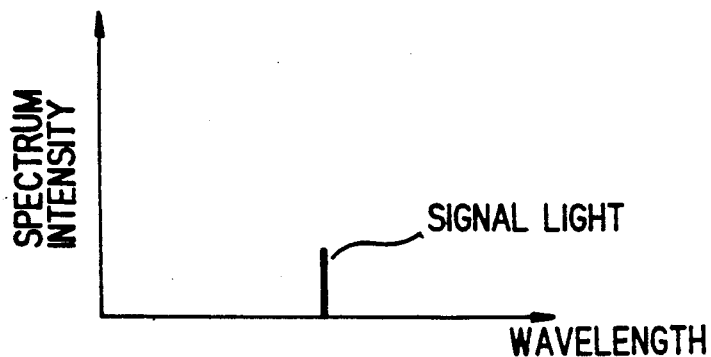
FIGS. 2A to 2D are graphs showing spectrum intensities of lights correlating to wavelength in operation of the optical amplifying apparatus in the first preferred embodiment according to the invention.

First, an optical amplifying apparatus in a first preferred embodiment will be explained. As shown in FIG. 1, the optical amplifying apparatus 100 includes an optical amplifier 101 which amplifies a signal light, optical dividing mirrors 106 and 109 which transmit most of a signal light and reflect a little part thereof, a narrow-band optical filter 104 which transmits a predetermined frequency range of the signal light, photodetectors 107 and 111 which detect the reflected and transmitted portions of the signal light, respectively, and convert the signal lights to electric signals, and a controller 113 which controls a gain of amplification of the optical amplifier 101 in accordance with the electric signals supplied from the photodetectors 107 and 111.

Figure 2B:
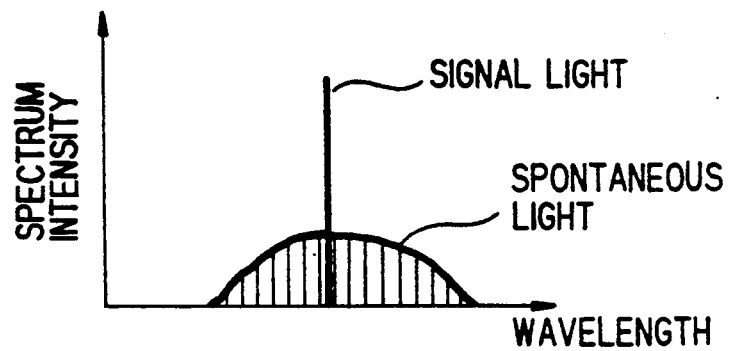
Figure 2C:
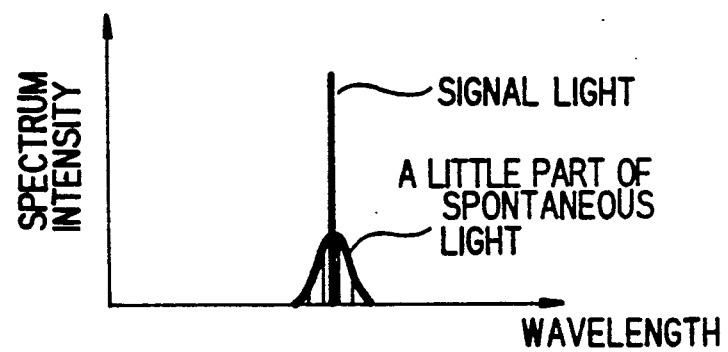
Figure 2D:
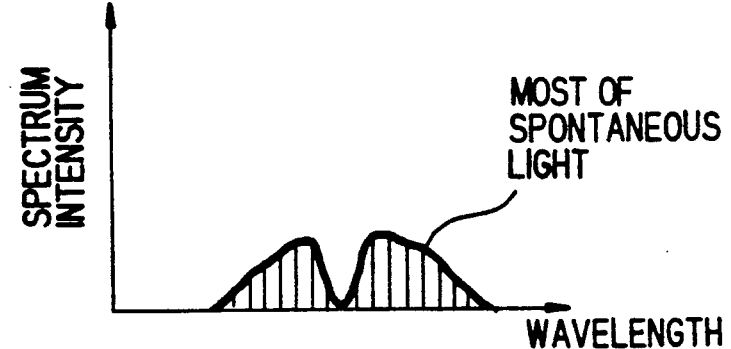
Figure 3A:
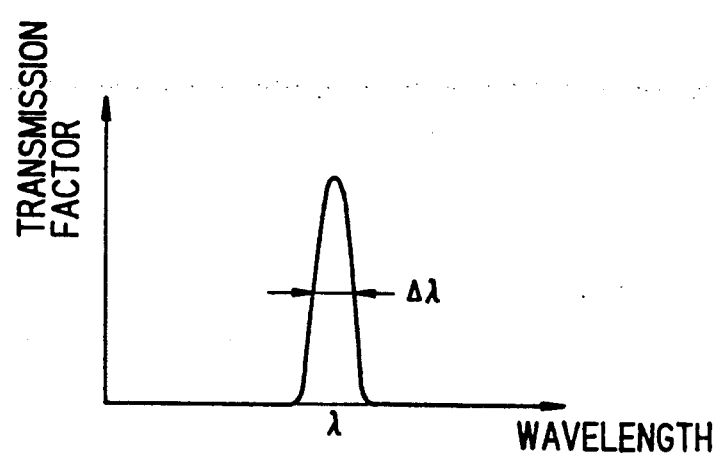
FIGS. 3A and 3B are graphs showing respectively the transmission and reflection factors correlating to wavelength in operation of the optical amplifying apparatus in the first preferred embodiment according to the invention.
Figure 3B:
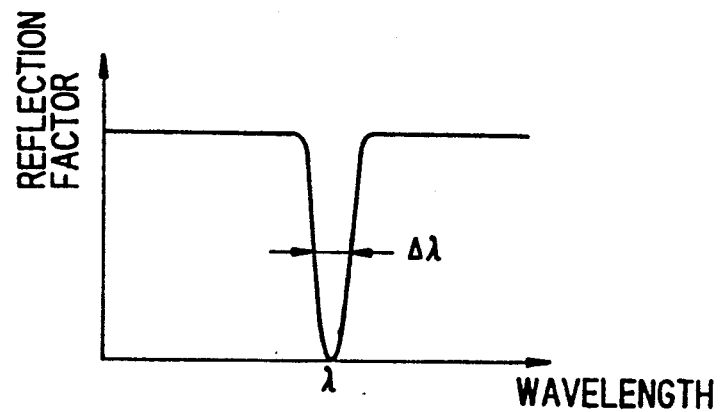

In operation, an input signal light 102 is supplied to the optical amplifier 101 in which the input signal light 102 is amplified to be an amplified signal light 103. The input signal light 102 has spectrum having a narrow peak figure corresponding to the signal light as shown in FIG. 2A, however, the amplified signal light 103 has a spectrum having not only the narrow peak figure corresponding to the signal light but also a broad figure corresponding to the spontaneous light emitted from the optical amplifier 101 as shown in FIG. 2B. The amplified signal light 103 is transmitted through the optical dividing mirror 106 and then through the narrow-band optical filter 104. The narrow-band optical filter 104 has the transmission factor as shown in FIG. 3A, so that most of the spontaneous light is removed from the amplified light 103 (FIG. 2B) to be a transmitting light 108 as shown in FIG. 2C. A part of the amplified signal light 103 reflects at the narrow-band optical filter 104. The narrow-band optical filter 104 has the reflection factor as shown in FIG. 3B, so that the reflecting light 105 includes most of the spontaneous light but some portion corresponding to the wavelength of the signal light, as shown in FIG. 2D. Most of the transmitting light 108 is transmitted through the optical dividing mirror 109 to be an output signal light 112 of the optical amplifying apparatus 100, however, some part of the transmitting light 108 reflects at the optical dividing mirror 109 to be supplied to the photodetector 111.

Figure 4A:
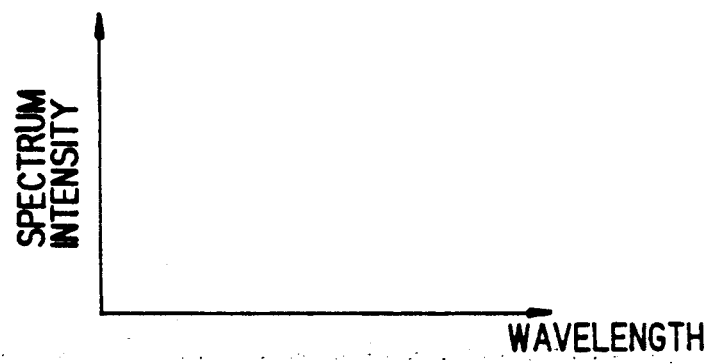
FIGS. 4A to 4D are graphs showing spectrum intensities of lights correlating to wavelength in operation of the optical amplifying apparatus in the first preferred embodiment according to the invention.
Figure 4B:
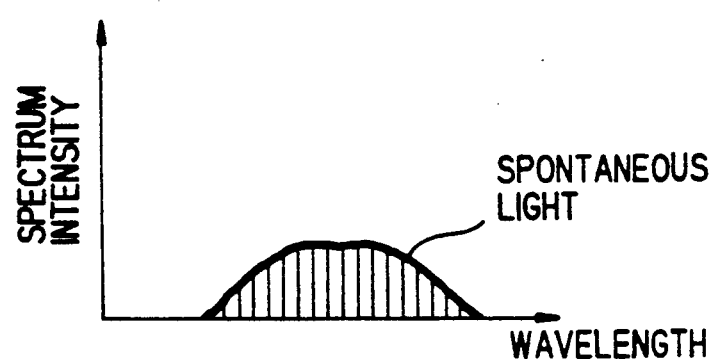
Figure 4C:
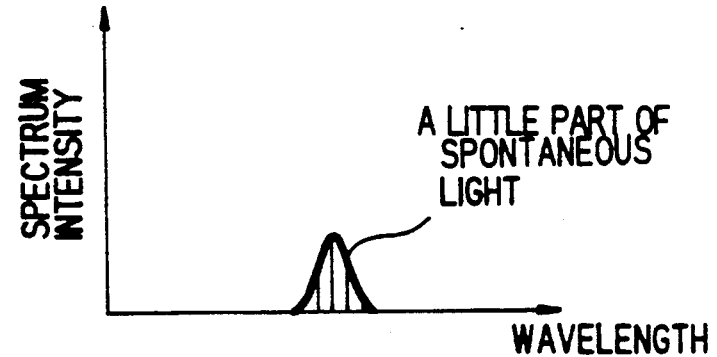
Figure 4D:
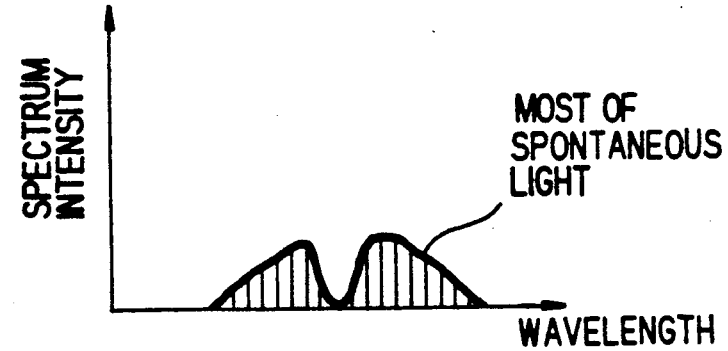

Detection of the input signal light 102 supplied to the optical amplifier 101 is carried out by the intensity ratio of the reflecting light 105 detected by the photodetector 107 to the divided light 110 of the transmitting light 108 detected by the photodetector 111. If there is no or little input signal light supplied to the optical amplifier 101, as shown in FIG. 4A, the amplified signal light 103 has the spectrum having a broad figure corresponding to the spontaneous light emitted from the optical amplifier 101 without any peak figure corresponding to the signal light, as shown in FIG. 4B. Therefore, the transmitting light 108 which is transmitted through the narrow-band optical filter 104 has the spectrum having a short peak corresponding to the minority of the spontaneous light emitted from the optical amplifier 101, as shown in FIG. 4C. On the other hand, the reflecting light 105 has the spectrum having a broad figure including most of the spontaneous light but some portion corresponding to the wavelength of the signal light, as shown in FIG. 4D. In this case, the figure of the spectrum of the spontaneous light emitted from the optical amplifier 101 does not change correlating to the change of the exciting level of the optical amplifier 101, so that the intensity ratio of the transmitting light 108 to the reflecting light 105 is not dependent on the exciting level thereof. Therefore, the detection of the input signal light 102 can be carried out by monitoring the intensity ratio of the transmitting light 108 to the reflecting light 105. In case of the optical amplifier 101 which is an optical fiber amplifier having wide band characteristics, for example, the spectrum width of the spontaneous light thereof becomes approximately 30 nm. If the band width of the narrow-band optical filter 104 is 3 nm, for example, the intensity ratio of the transmitting light 108 to the reflecting light 105 becomes approximately 1/9. Therefore, if the intensity ratio thereof is not less than approximately 1/9, it is judged that the input signal light 102 is supplied to the optical amplifier 101.

The controller 113 detects whether the intensity ratio of the transmitting light 108 to the reflecting light 105 is not less than the predetermined value which indicates that the input signal light 102 is supplied to the optical amplifier 101. If the intensity ratio is lower than the predetermined value, it is judged that the input signal light 102 is not supplied to the optical amplifier 101. In this case, the controller 113 supplies a control signal to the optical amplifier 101 so that the exciting level thereof becomes the predetermined level. If the intensity ratio is over the predetermined value, it is judged that the input signal light 102 is supplied to the optical amplifier 101. In this case, the controller 113 supplies a control signal to the optical amplifier 101 to control the exciting level so that the intensity of the transmitting light 108 becomes the predetermined level. In such a manner explained above, the intensity level of the output signal light 112 of the optical amplifying apparatus 100 is maintained to be constant if the input signal light 102 is supplied thereto, and the gain of the optical amplifier 102 is maintained to be constant if the input signal light 102 is not supplied to the optical amplifier 101.

Figure 5:
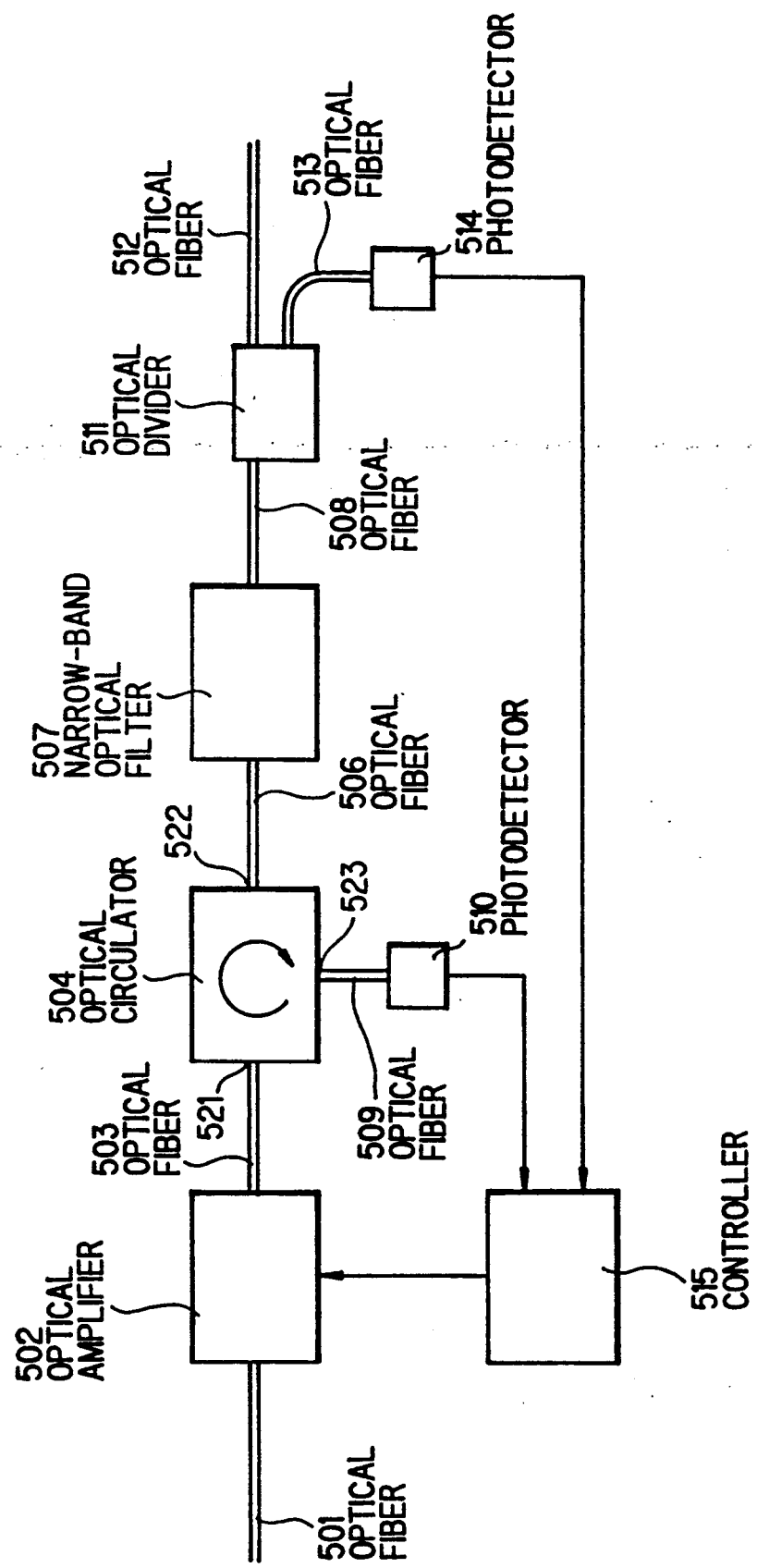
FIG. 5 is a block diagram of an optical amplifying apparatus in a second preferred embodiment according to the invention.
Figure 6:
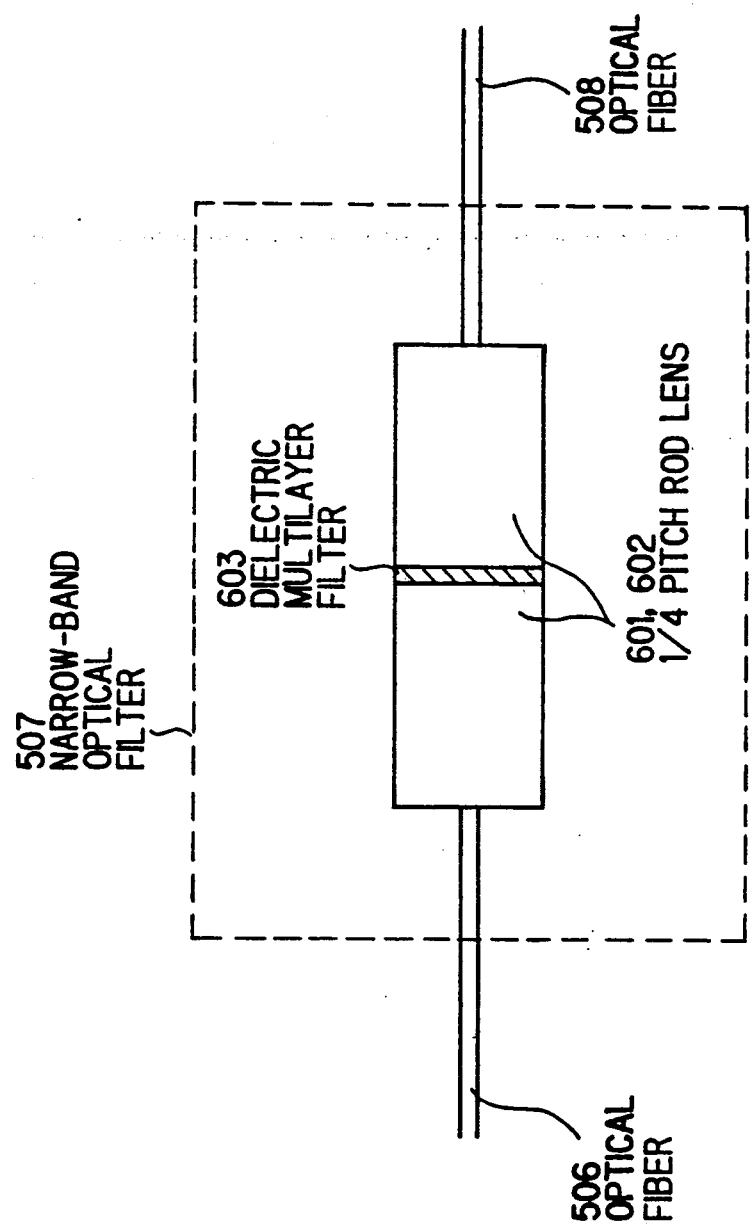
FIG. 6 is a cross-sectional view illustrating a narrow-band optical filter in the optical amplifying apparatus in FIG. 5.

Next, an optical amplifying apparatus in a second preferred embodiment will be explained. As shown in FIG. 5, the optical amplifying apparatus includes an optical amplifier 502, an optical circulator 504, a narrow-band optical filter 507, photodetectors 510 and 514, and a controller 515. As shown in FIG. 6, the narrow-band optical filter 507 includes ¼-pitch rod lenses 601 and 602 and a dielectric multilayer filter 603 sandwiched by the lenses 601 and 602. The surface of the dielectric multilayer filter 603 is placed approximately vertical to the central axes of the lenses 601 and 602.

In operation, an input signal light is transmitted through an optical fiber 501 to be supplied to the optical amplifier 502 in which the input signal light is amplified to be supplied to the optical circulator 504 as an amplified signal light including the spontaneous light as shown in FIG. 2B. The amplified signal light is transmitted through an optical fiber 503, and then transmitted through the optical circulator 504 from a first terminal 521 to a second terminal 522 to be supplied to the narrow-band optical filter 507 through an optical fiber 506. In the narrow-band optical filter 507, most of the spontaneous light is removed from the amplified signal light so that a transmitting light is supplied to an optical fiber 508. On the other hand, most of the spontaneous light reflects at the narrow-band optical filter 507 to be supplied back to the second terminal of the optical circulator 504 and transmitted from a third terminal 523 thereof through an optical fiber 509 to be supplied to the photodetector 510 in which the signal light is converted to an electric signal to be supplied to the controller 515. On the other hand, the transmitting light from the narrow-band optical filter 507 is supplied to the optical divider 511 through the optical fiber 508. In the optical divider 511, 98% of the transmitting light is supplied to an optical fiber 512 as an output signal light of the optical amplifying apparatus, while 2% thereof is supplied through an optical fiber 513 to the photodetector 514 in which the signal light is converted to an electric signal to be supplied to the controller 515. The controller 515 controls the gain of the optical amplifier 502 in accordance with the electric signals supplied from the photodetectors 510 and 514. Operation of controlling the optical amplifier 502 is carried out in the same manner explained in the first preferred embodiment, so that the operation will not be explained. In this embodiment, most of the reflecting light from the narrow-band optical filter 507 can be detected by the photodetector 510, because the reflecting light is transmitted through the optical circulator 504 with little transmission loss.

Further, the optical amplifying apparatus includes only one optical divider which may cause intensity loss. Therefore, the intensity loss of the output signal light can be decreased.

Figure 7:
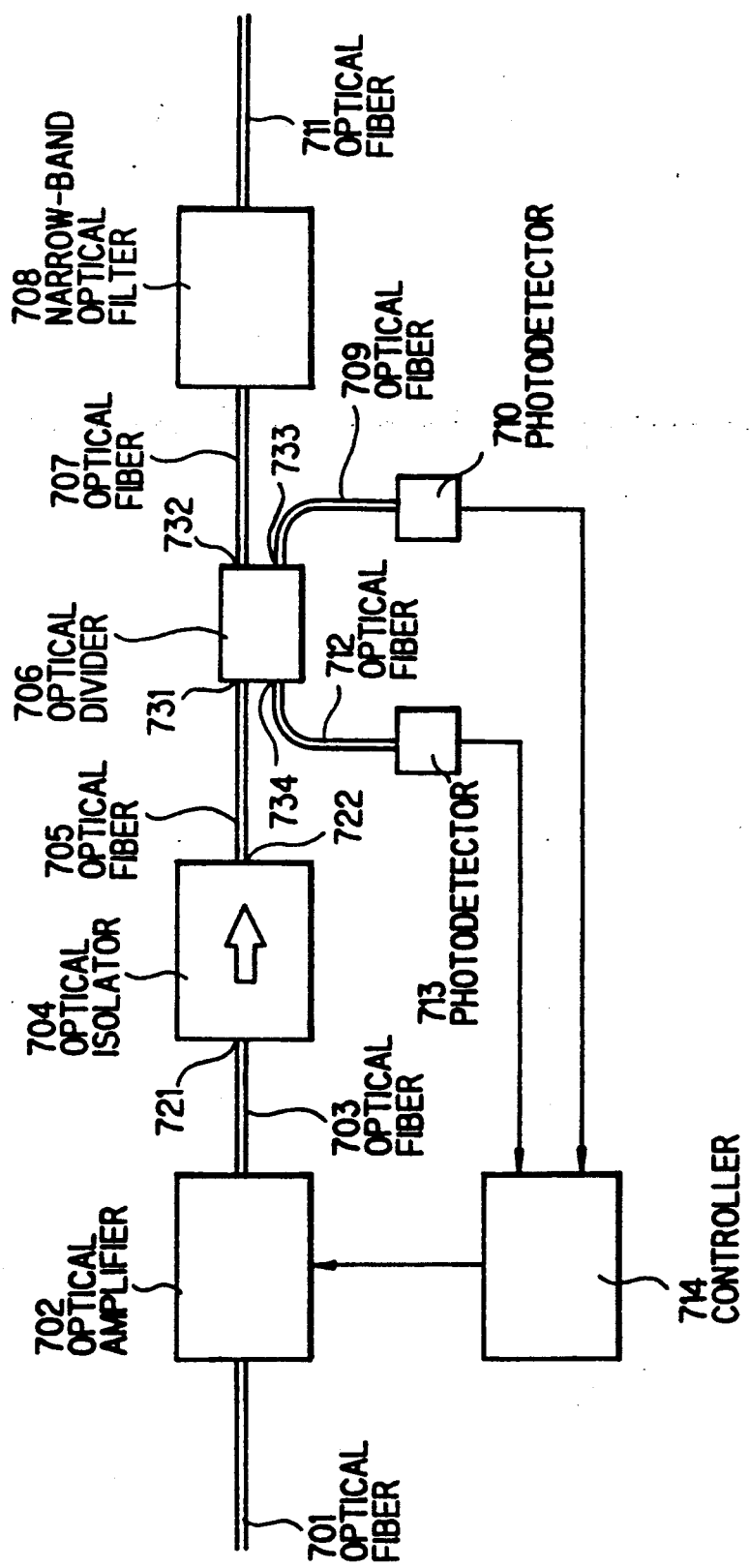
FIG. 7 is a block diagram of an optical amplifying apparatus in a third preferred embodiment according to the invention.

Next, an optical amplifying apparatus in a third preferred embodiment will be explained. As shown in FIG. 7, the optical amplifying apparatus includes an optical amplifier 702, an optical isolator 704, an optical divider 706, a narrow-band optical filter 708, photodetectors 710 and 713, and a controller 714. The optical isolator 704 transmits a signal light from a first terminal 721 to a second terminal 722, while it does not transmit a light from the second terminal 722 to the first terminal 721. The narrow-band optical filter 708 has the same structure as that of the narrow-band optical filter 507 in FIG. 5.

In operation, an input signal light is transmitted through an optical fiber 701 to the optical amplifier 702 in which the input signal light is amplified to produce an amplified signal light including the spontaneous light as shown in FIG. 2B. The amplified signal light is transmitted through an optical fiber 703 to the first terminal 721 of the optical isolator 704 and supplied from the second terminal 722 thereof through an optical fiber 705 to a first terminal of the optical divider 706. In the optical divider 706, 90% of the transmitting light is supplied to the narrow-band optical filter 708 through an optical fiber 707 from a second terminal 732, while 10% thereof is supplied to the photodetector 710 through an optical fiber 709 from a third terminal 733. In the narrow-band optical filter 708, most of the spontaneous light is removed from the amplified signal light to be supplied to an optical fiber 711. On the other hand, most of the spontaneous light reflects at the narrow-band optical filter 708 to be supplied back to the second terminal 732 of the optical divider 706 and supplied from a third terminal 734 thereof through an optical fiber 712 to be supplied to the photodetector 713 in which the signal light is converted to an electric signal to be supplied to the controller 714. The controller 714 controls the gain of the optical amplifier 702 in accordance with the electric signals supplied from the photodetectors 710 and 713. Operation of controlling the optical amplifier 702 is carried out in the same manner explained in the first preferred embodiment, so that the operation will not be explained. In this embodiment, the transmitting light which is detected by the photodetector 710 includes not only the signal light but also the spontaneous light as shown in FIG. 2B. However, the intensity ratio of the signal light detected by the photodetector 710 to that detected by the photodetector 713 in case of no signal light supplied to the optical amplifier 702 is known beforehand, so that it is judged that the input signal light is supplied to the optical amplifier 702 if the intensity ratio is larger than a predetermined value which is in case of no signal light and that the input signal light is not supplied thereto if the intensity ratio is the same as the predetermined value in case of no signal light. In this embodiment, there is an advantage in that the intensity loss of the amplified signal light can be reduced in spite of using the optical divider for monitoring the reflecting light, because only one optical divider is used for monitoring both the amplified signal light and the reflecting light.

Figure 8:
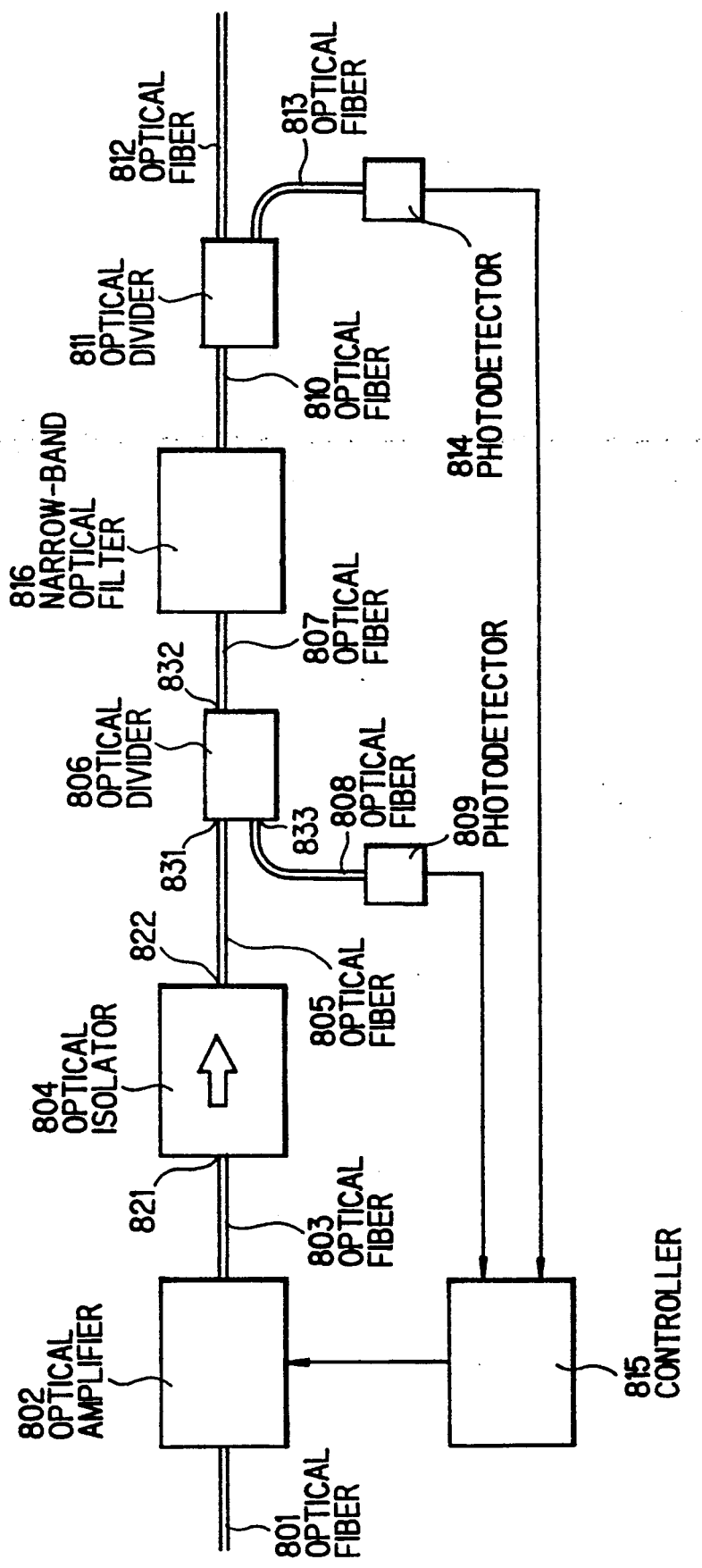
FIG. 8 is a block diagram of an optical amplifying apparatus in a fourth preferred embodiment according to the invention.

Next, an optical amplifying apparatus in a fourth preferred embodiment will be explained. As shown in FIG. 8, the optical amplifying apparatus includes an optical amplifier 802, an optical isolator 804, optical dividers 806 and 811, a narrow-band optical filter 816, photodetectors 808 and 814, and a controller 815. Structures of the optical isolator 804 and the narrow-band optical filter 816 are the same as those of the optical isolator 704 and the narrow-band optical filter 708 in FIG. 7, respectively.

In operation, an input signal light is transmitted by an optical fiber 801 to be supplied to the optical amplifier 802 in which the input signal light is amplified to be supplied to a first terminal 821 of the optical isolator 804 as an amplified signal light including the spontaneous light as shown in FIG. 2B. The amplified signal light is transmitted through an optical fiber 803 to a first terminal 821 of the optical isolator 804 and supplied from a second terminal 822 thereof through an optical fiber 805 to a first terminal 831 of the optical divider 806 in which 90% of the amplified signal light is supplied to the narrow-band optical filter 816 through an optical fiber 807 from a second terminal 832 thereof. In the narrow-band optical filter 816, most of the spontaneous light is removed from the amplified signal light to be supplied to an optical fiber 810 as a transmitting light. On the other hand, most of the spontaneous light reflects at the narrow-band optical filter 816 to be supplied back to the second terminal 832 of the optical divider 806 and 90% thereof is supplied from a third terminal 833 of the optical divider 806 through an optical fiber 808 to the photodetector 809 in which the signal light is converted to an electric signal to be supplied to the controller 815. The transmitting light from the narrow-band optical filter 816 is supplied to the optical divider 811 in which 90% thereof is supplied to an optical fiber 812 as an output signal light of the optical amplifying apparatus, while 10% thereof is supplied through an optical fiber 813 to the photodetector 814 in which the signal light is converted to an electric signal to be supplied to the controller 815. The controller 815 controls the gain of the optical amplifier 802 in accordance with the electric signals supplied from the photodetectors 809 and 814. Operation of controlling the optical amplifier 802 is carried out in the same manner explained in the first preferred embodiment, so that the operation will not be explained.

Figure 9:
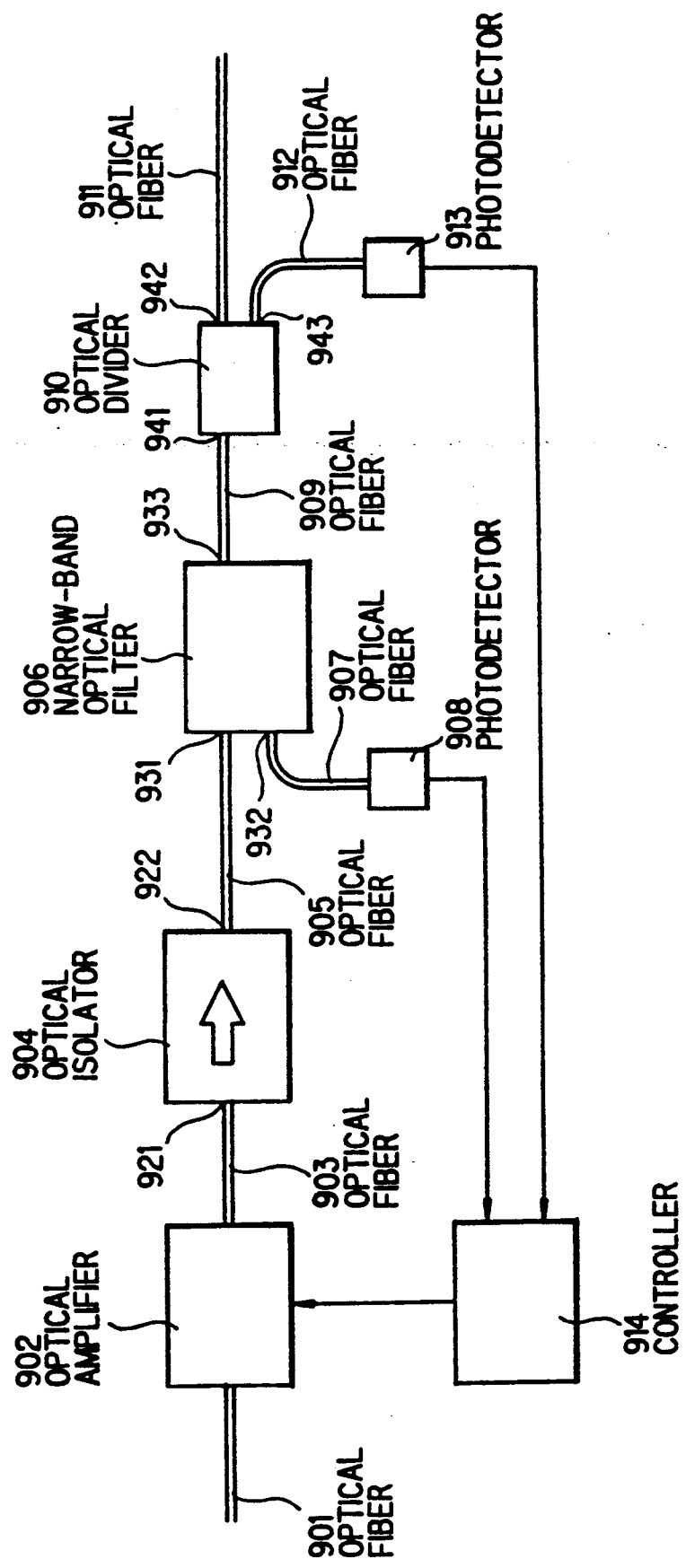
FIG. 9 is a block diagram of an optical amplifying apparatus in a fifth preferred embodiment according to the invention.
Figure 10:
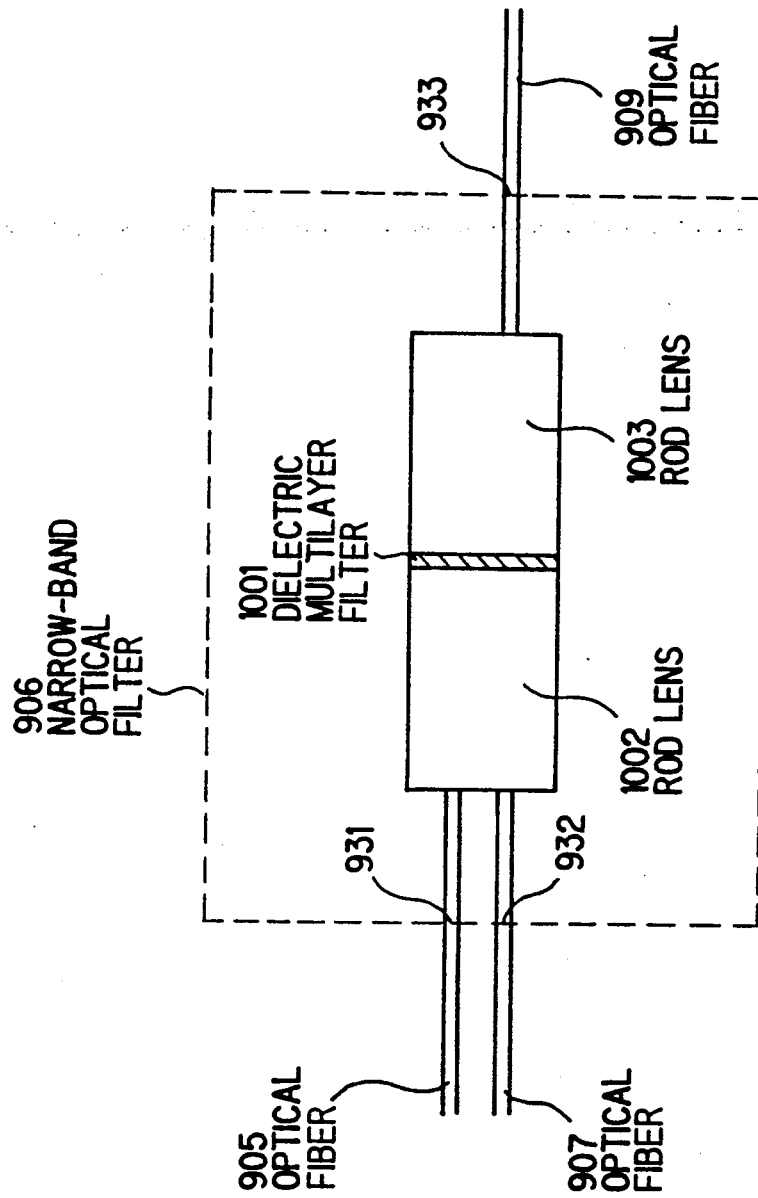
FIG. 10 is a cross-sectional view illustrating a narrow-band optical filter in the optical amplifying apparatus in FIG. 9.

Next, an optical amplifying apparatus in a fifth preferred embodiment will be explained. As shown in FIG. 9, the optical amplifying apparatus includes an optical amplifier 902, an optical isolator 904, a narrow-band optical filter 906, an optical divider 910, photodetectors 908 and 913, and a controller 914. As shown in FIG. 10, the narrow-band optical filter 906 includes $\frac{1}{4}$-pitch rod lenses 1002 and 1003 and a dielectric multilayer filter 1001 having the transmission/reflection characteristic shown in FIGS. 3A and 3B. Optical fibers 907 and 909 are connected to the $\frac{1}{4}$-pitch rod lens 1002 of the narrow-band optical filter 906 so as to be located symmetrically, each having the same axis parallel to the axis of the lens 1002. On the other hand, an optical fiber 905 is connected to the $\frac{1}{4}$-pitch rod lens 1003 of the narrow-band optical filter 906 to have the axis parallel to the axis of the lens 1003, and the point of the optical fiber 909 is located at a place where a light transmitted by the optical fiber 905 forms an image. The optical isolator 904 has the same structure as that of the optical isolator 704 in FIG. 7.

In operation, an input signal light is transmitted by an optical fiber 901 to be supplied to the optical amplifier 902 in which the input signal light is amplified to be supplied to a first terminal 921 of the optical isolator 904 as an amplified signal light including the spontaneous light as shown in FIG. 2B. The amplified signal light is transmitted through an optical fiber 903 to a first terminal 921 of the optical isolator 904 and supplied from a second terminal 922 thereof to a first terminal 931 of the narrow-band optical filter 906 through an optical fiber 905. In the narrow-band optical filter 906, most of the spontaneous light is removed from the amplified light to be supplied to an optical fiber 909 as a transmitting light. On the other hand, most of the spontaneous light reflects at the narrow-band optical filter 906 to be supplied from a third terminal 932 thereof through an optical fiber 907 to the photodetector 908 in which the signal light is converted to an electric signal to be supplied to the controller 914. The transmitting light from the second terminal 933 of the narrow-band optical filter 906 is supplied to a first terminal 941 of the optical divider 910 in which 98% thereof is supplied to and optical fiber 911 as an output signal light of the optical amplifying apparatus, while 2% thereof is supplied through an optical fiber 912 to the photodetector 913 in which the signal light is converted to an electric signal to be supplied to the controller 914. The controller 914 controls the gain of the optical amplifier 902 in accordance with the electric signals supplied from the photodetectors 908 and 913. Operation of controlling the optical amplifier 902 is carried out in the same manner explained in the first preferred embodiment, so that the operation will not be explained.

In these embodiments, a filter including a dielectric multilayer filter is used as a narrow-band optical fiber, however, other type of filters such as a Fabry-Perot optical filter may be used instead. In addition, the dividing ratio of lights in the optical divider may be determined in accordance with various conditions instead of the ratios of 1:9 or 2:98 used in the above described embodiments.

Although the invention has been described with respect to specific embodiments for complete and clear disclosure, the appended claims are not to be thus limited and alternative constructions that may occur to one skilled in the art may fairly fall within the basic teaching herein set forth.

What is claimed is:

1. An optical amplifying apparatus, comprising:
   amplifying means for amplifying a signal light;
   removing means for removing spontaneous light emitted, from said signal light as amplified by said amplifying means;
   first detecting means for detecting a first light which is transmitted through said removing means to provide a first electric signal;
   second detecting means for detecting a second light which reflects at said removing means to provide a second electric signal; and
   controlling means for controlling a gain of said amplifying means by comparing intensities of said first and second lights in accordance with said first and second electric signals.

2. An optical amplifying apparatus, according to claim 1, wherein:
   said removing means is a narrow-band optical filter.

3. An optical amplifying apparatus, according to claim 2, wherein:
   said narrow-band optical filter comprises a dielectric multilayer filter.

4. An optical amplifying apparatus, according to claim 1, further comprising:
   first dividing means for dividing a light in which said signal light supplied from said amplifying means is transmitted therethrough and said second light which reflects at said removing means reflects thereat to be supplied to said second detecting means; and
   second dividing means for dividing a light in which most of said first light supplied from said removing means is transmitted therethrough and a little part thereof reflects thereat to be supplied to said first detecting means.

5. An optical amplifying apparatus, according to claim 1, further comprising:
   an optical circulator having first to third terminals in which said signal light supplied from said amplifying means is transmitted from said first terminal to said second terminal to be supplied to said removing means and said second light which reflects at said removing means is transmitted from said second terminal to said third terminal to be supplied to said second detecting means; and
   dividing means for dividing said first light supplied from said removing means in which most of said first light is supplied to an output terminal of said optical amplifying apparatus as an output signal light and a little part thereof is supplied to said first detecting means.

6. An optical amplifying apparatus, according to claim 1, further comprising:
   an optical isolator having first and second terminals in which said signal light supplied from said amplifying means is transmitted from said first terminal to said second terminal; and
   dividing means for dividing a light, said dividing means having first to fourth terminals in which most of said signal light supplied from said optical isolator is transmitted from said first terminal to said second terminal to be supplied to said removing means, a little part thereof is transmitted from said first terminal to said third terminal to be supplied to said first detecting means, and a predetermined proportion of said second light supplied from said removing means is transmitted from said second terminal to said fourth terminal to be supplied to said second detecting means.

7. An optical amplifying apparatus, according to claim 1, further comprising:
   an optical isolator having first and second terminals in which said signal light supplied from said amplifying means is transmitted from said first terminal to said second terminal and any light is not transmitted from said second terminal to said first terminal;
   first dividing means for dividing a light having first to third terminals in which most of said signal light supplied from said optical isolator is transmitted from said first terminal to said second terminal to be supplied to said removing means and a little part of said second light supplied from said removing means is transmitted from said second terminal to said third terminal to be supplied to said second detecting means; and
   second dividing means for dividing a light having first to third terminals in which most of said second light supplied from said removing means is transmitted from said first terminal to said second terminal to be supplied to an output terminal of said optical amplifying apparatus and a little part thereof is transmitted from said first terminal to said third terminal to be supplied to said second detecting means.

8. An optical amplifying apparatus, according to claim 1, further comprising:
   an optical isolator having first and second terminals in which said signal light supplied from said amplifying means is transmitted from said first terminal to said second terminal and any light is not transmitted from said second terminal to said first terminal; and
   dividing means for dividing a light, said dividing means having first to third terminals in which most of said first light supplied from said removing means is transmitted from said first terminal to said second terminal to be supplied to an output terminal of said optical amplifying apparatus and a little part thereof is transmitted from said first terminal to said third terminal to be supplied to said first detecting means;

wherein said removing means has first to third terminals in which said signal light supplied from said optical isolator is transmitted from said first terminal to said second terminal to be supplied to said dividing means as said first terminal, and said second light is supplied from said third terminal to said second detecting means.

* * * * *